United States Patent
Lien et al.

(10) Patent No.: US 10,783,973 B1
(45) Date of Patent: Sep. 22, 2020

(54) MEMORY DEVICE HAVING PARAMETER ADJUSTING MECHANISM AND METHOD OF ADJUSTING PARAMETER BY MEMORY DEVICE

(71) Applicant: Winbond Electronics Corp., Taichung (TW)

(72) Inventors: Chuen-Der Lien, San Jose, CA (US); Chi-Shun Lin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/697,139

(22) Filed: Nov. 26, 2019

(51) Int. Cl.
 *G11C 16/26* (2006.01)
 *G06F 11/10* (2006.01)
 *G11C 29/00* (2006.01)
 *G11C 29/42* (2006.01)

(52) U.S. Cl.
 CPC .......... *G11C 16/26* (2013.01); *G06F 11/1068* (2013.01); *G11C 29/00* (2013.01); *G11C 29/42* (2013.01)

(58) Field of Classification Search
 CPC ......... G11C 16/26; G11C 29/00; G11C 29/42; G11C 5/005
 See application file for complete search history.

(56) References Cited

U.S. PATENT DOCUMENTS

| | | | |
|---|---|---|---|
| 7,558,109 B2 | 7/2009 | Brandman et al. | |
| 8,930,778 B2* | 1/2015 | Cohen | G06F 11/2094 |
| | | | 714/704 |
| 9,747,974 B2 | 8/2017 | Tai et al. | |
| 2012/0254699 A1 | 10/2012 | Ruby et al. | |
| 2013/0343131 A1 | 12/2013 | Wu et al. | |
| 2017/0186472 A1* | 6/2017 | Jan | G11C 29/021 |

FOREIGN PATENT DOCUMENTS

| | | |
|---|---|---|
| TW | I584285 | 5/2017 |
| TW | I603332 | 10/2017 |

\* cited by examiner

*Primary Examiner* — Han Yang
(74) *Attorney, Agent, or Firm* — JCIPRNET

(57) ABSTRACT

The disclosure provides a memory device including: a connection interface; a memory array associated with a parameter; and a memory control circuit configured at least to: receive operations, each of the operations being a read operation or a write operation, through the connection interface to perform the operations on the memory array; detect, based on performing the operations on the memory array, a read error which is either a binary 0 read error or a binary 1 read error; update the error counter by incrementing an counter value of the error counter in response to the read error being the binary 1 read error and decreasing the counter value in response to the read error being the binary 0 read error; and adjust the parameter in response to the counter value having reached a positive predetermined threshold or a negative predetermined threshold.

20 Claims, 8 Drawing Sheets

MEMORY DEVICE HAVING PARAMETER ADJUSTING MECHANISM AND METHOD OF ADJUSTING PARAMETER BY MEMORY DEVICE

TECHNICAL FIELD

The disclosure is directed to a memory device having parameter adjusting mechanism and a method of adjusting a parameter by a memory device.

BACKGROUND

Conventionally, non-volatile memory devices such as a flash memory, resistive random-access memory (RRAM), or other types of emerging memories are made as integrated circuits placed on a chip which would degrade due to wears and tears, normal operations, data retentions, heating, cycling, and etc. Various parameters of a memory device may need to be adjusted in real time in order to retain or to improve its overall quality and performance. The parameters may include a read reference voltage, a read reference current, a read verify reference, a write voltage, and etc. Thus, as long as schemes for adjusting these parameters can be improved, a yield improvement and a greater product reliability may also be achieved.

SUMMARY OF THE DISCLOSURE

Accordingly, the disclosure is directed to a memory device having a parameter adjusting mechanism and a method of adjusting a parameter by a memory device.

In one of the exemplary embodiments, the disclosure is directed to memory device which includes not limited to: a connection interface; a memory array including a plurality of memory cells associated with a parameter; and a memory control circuit, coupled to an error counter, the connection interface and the memory array, and configured at least to: receive operations, each of the operations being a read operation or a write operation, through the connection interface to perform the operations on the memory array; detect, based on performing the operations on the memory array, a read error which is either a binary 0 read error or a binary 1 read error; update the error counter by incrementing an counter value of the error counter in response to the read error being the binary 1 read error and decreasing the counter value in response to the read error being the binary 0 read error; and adjust the parameter in response to the counter value having reached a positive predetermined threshold or a negative predetermined threshold.

In one of the exemplary embodiments, the disclosure is directed to a method of adjusting a parameter by a memory device. The method includes not limited to: receiving operations, each of the operations being a read operation or a write operation, through a connection interface to perform the operations on a memory array; detecting, based on performing the operations on the memory array, a read error which is either a binary 0 read error or a binary 1 read error; updating an error counter of the memory array by incrementing an counter value of the error counter in response to the read error being the binary 1 read error and decreasing the counter value in response to the read error being the binary 0 read error; and adjusting the parameter in response to the counter value having reached a positive predetermined threshold or a negative predetermined threshold.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also, the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
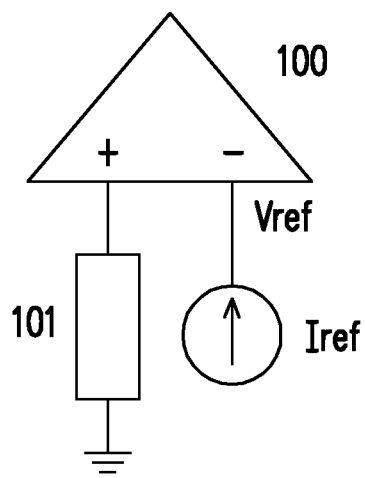
FIG. 1 illustrates a sense amplifier voltage reference and current reference according to an exemplary embodiment of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

In this disclosure, reading operations are performed in memory addresses to determine a difference between a total quantity of binary 0 read errors and a total quantity of binary 1 read errors. A hardware error counter or a software/firmware error counter could be used to record such difference during one or more operations in order to read one or more selected memory blocks in real time. One or more parameters of the memory device could be adjusted in a factory setting or automatically adjusted in a user setting to improve the accuracy of a binary 1 read if a counting value is higher than a positive predetermined threshold. Conversely, one or more parameters could also be adjusted to improve the accuracy of a binary 0 read if the counting value is less than a negative predetermined threshold.

The binary 0 read error is a read error of a 1 bit output which should have been read as a binary value 1, but the value of the 1 bit output turns out to be a 0 as read. Conversely, the binary 0 read error is a read error of a 1 bit output which should have been read as a binary value 0, but the value of the 1 bit output turns out to be a 1 as read.

Referring a sense amplifier circuit of FIG. 1 as an example. A sense amplifier 100 could be connected to multiple memory cells with each memory cell being capable of storing a binary value. For the sense of amplifier circuit of FIG. 1, a cell 101 may output a voltage or a current to be compared against a reference voltage Vref or a reference current Iref. The amplifier circuit 100 may then amplify the difference between the voltage or the current output of the cell 101 against Vref or Iref to determine whether the data of the cell is a binary 0 or a binary 1.

Next, the binary 0 read error or the binary 1 read error is detected, and the amounts of binary 1 read errors and binary 0 read errors are counted. Once the difference between the amount of binary 1 read errors and the amount of binary 0 read errors has reached a predetermined threshold, the Vref or the Iref could be adjusted manually or automatically. The automatic adjustment could be accomplished based on applying an automatic error detection technique together with a fuse technique to adjust Vref or Iref.

The memory device could be, for example, a resistive random-access memory (RRAM) for which most of the read errors are likely binary 1 read errors. Therefore, if the counter value has reached a positive predetermined number, then the write voltage or the write timing could be adjusted so as to improve its cycling endurance.

For another example, one or more error counters could be used to record the amount of binary 1 read errors and/or the amount of binary 0 read errors during a write operation of one or more selected memory blocks in real time. The write voltage and/or timing could be adjusted manually or automatically to improve the accuracy of the write operations if the counter value has been determined to be a higher than a positive predetermined number.

Figure 2:
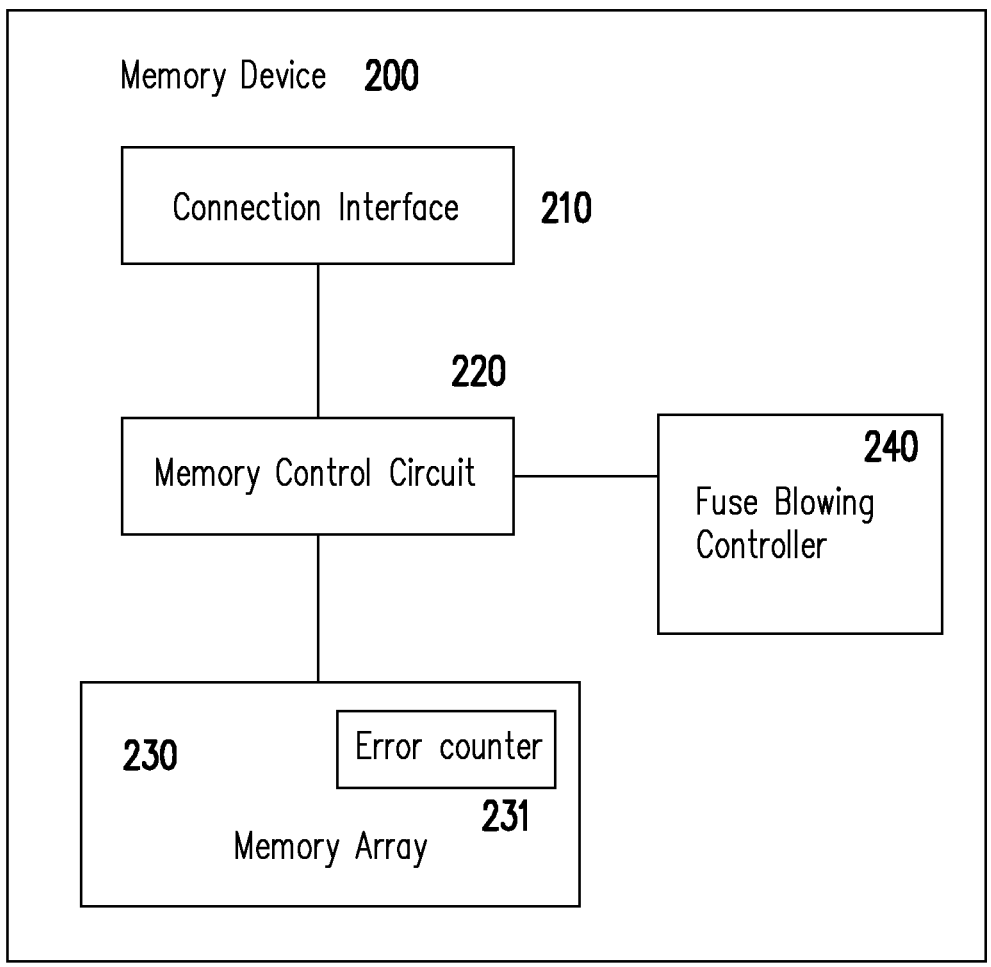
FIG. 2 shows a hardware block diagram of a memory device according to an exemplary embodiment of the disclosure.

FIG. 2 shows a hardware block diagram of a memory device 200. The memory device 200 may include a memory control circuit 220 electrically connected to a connection interface 210, a memory array 230, an error counter 231, and a fuse blowing controller 240. The connection interface 210 is configured receive or transmit a command and/or data to an external device.

The memory array 230 contains multiple memory banks as each of the memory banks may contain a plurality of memory cells for storing binary information. The error counter 231 may be used to record a difference between the amount of binary 1 errors and the amount of binary 0 read errors during a write operation. In some embodiments, the error counter 231 may just record the amount of binary 0 read errors or the amount of binary 1 read errors during a write operation or a read operation. The error counter 231 may only record a portion of a memory block or memory bank instead of the entire memory block or memory bank. Each memory block or memory bank may correspond to a dedicated error counter. Alternatively, an error counter could be shared by multiple memory blocks or memory banks.

The fuse blowing controller 240 is configured to blow one or more fuses in order to activate alternative circuits so as to replace or adjust existing functions. To be specific, for the memory device 200 of the disclosure, the fuse blowing controller 240 may store settings related to one or more parameters of the memory device 200 to be adjusted. For example, the fuse blowing controller 240 may store a binary value which corresponding to a specific setting of a parameter which could be a sensing reference such as a reference voltage or a reference current. The parameter could also be a write voltage, a program voltage, a set voltage, a reset voltage, a forming voltage, or a timing. Besides, by configuring the memory control circuit 220 to automatically adjust the binary value stored within the fuse blowing controller 240, the memory device 200 would be able to automatically adjust the sensing reference.

The memory control circuit 200 could be electrically connected to an error counter 231, the connection interface 210 and the memory array 230. It is worth noting that even though the error counter 231 is shown as a part of the memory array 230, the error counter may alternatively be a part of the memory control circuit 220. The memory control circuit 220 could be configured to receive one or more operations through the connection interface 210 with each of the operations being a command, a read operation, or a write operation. The memory control circuit 220 could be further configured to detect, in response to performing the one or more read or write operations on the memory array 230, a read error which is either a binary 0 read error or a binary 1 read error.

The memory control circuit 220 could be further configured to update the error counter 231 by incrementing the counter value in response to detecting a binary 1 read error and by decrementing the counter value by 1 in response to detecting a binary 0 read error. Subsequently, the memory control circuit 220 may adjust the parameter in response to the counter value having reached a positive predetermined threshold or a negative predetermined threshold. According to an exemplary embodiment, the memory control circuit 220 may adjust the sensing reference in response to the counter value of the error counter 231 having reached an absolute value of a predetermined threshold.

Essentially, the error counter 231 records a difference between an amount of binary 1 read errors and an amount of binary 0 read errors by performing a one unit increment in response to detecting a binary 1 read error and by performing a one unit decrement in response to detecting a binary 0 read error.

In some embodiments, when the memory control circuit 220 is performing a read operation on the memory array, the read operation could be performed with a built-in margin so as to allow passing bits to have good margins.

The memory control circuit 220 could be configured to adjust the sensing reference by resetting the counter value to zero, performing read operations on the plurality of memory cells, accumulating the amount of binary 1 read errors and the amount of binary 0 read errors, and adjusting the sensing reference so as to decrease either the amount of binary 1 read errors or the amount of binary 0 read errors based on whichever is higher. The memory control circuit 220 could be further configured to repeatedly adjust the sensing reference until the counter value is below a positive predetermined threshold or is higher than a negative predetermined threshold.

The memory control circuit 220 could be configured to update the error counter by applying a predetermined data pattern and a binary opposite of the predetermined data pattern before memory control circuit is configured to adjust the reference voltage or the reference current. Since a sensing reference could be a function of temperature, the memory control circuit 200 could be configured to adjust the sensing reference at different temperatures as the sensing reference varies according to different temperatures.

The adjustment of the parameter as describe above could be performed when the memory device 200 is performing a test while still in a factory. Alternatively, the adjustment of parameter could be performed while the memory device 200 is performing a power on operation, is performing a power down operation, or in response to receiving a command. The adjustment of the parameter could also be performed during a write operation. After the parameter has been adjusted, the counter value of the error counter 231 could reset to zero.

Figure 3:
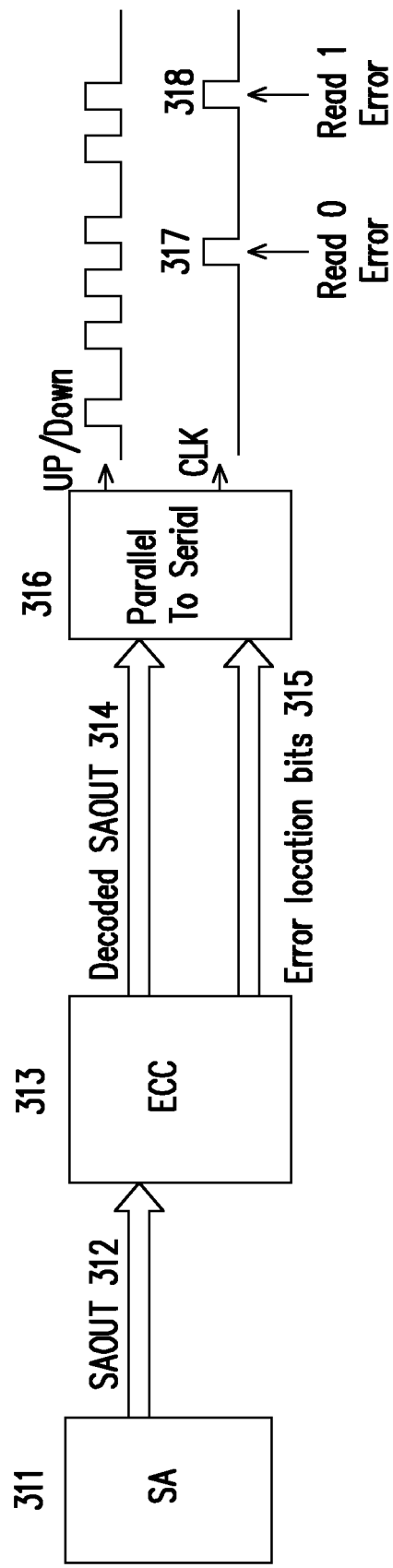
FIG. 3 shows a block diagram of functions performed by a memory array and a memory control circuit according to an exemplary embodiment of the disclosure.

FIG. 3 shows a block diagram of the functions performed by the memory array 230 and the memory control circuit 220 in order to generate a binary 0 read error and a binary 1 read error. As shown in FIG. 3, a sense amplifier (SA) 311 of a memory array may generate a 50-bit sense amplifier output (SAOUT) 312 which is received by error correction code (ECC) circuit 313 which implements a particular coding scheme such as the Bose-Chaudhuri-Hocquenghem code for example. The ECC circuit 313 could be implemented as a part of the memory control circuit 220. The ECC circuit 313 would then generate a 32-bit decoded SAOUT 314 and error location bits 315 which describes each location where a read error may have occurred. The decoded SAOUT 314 and error location bits 315 are sent to a parallel to serial converter 316 which converts data from a parallel format to a serial format so as to output the decoded SAOUT 314 and error location bits 315 in a serial form. In this example, it is assumed that two errors 317 and 318 have occurred. The first error 317 is a binary 0 read error where a binary value of 0 was read but the actual value should have been a 1, and the second error 318 is a binary 1 read error where a binary value of 1 was read but the actual value should have been a 0. Subsequently the error location bits 315 in the serial form is transmitted to an error counter (e.g. 231).

Figure 4:
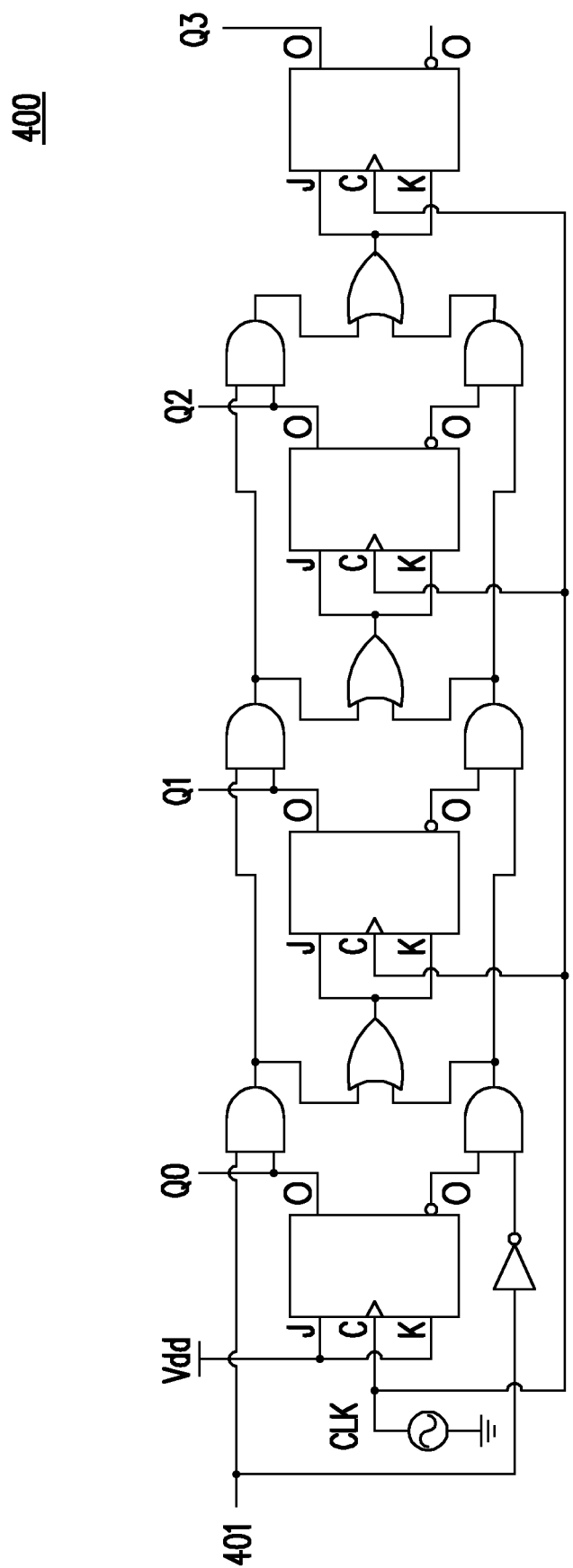
FIG. 4 shows a circuit diagram of an error counter according to an exemplary embodiment of the disclosure.

The error counter (e.g. 231) could be, for example, a 4-bit up/down error counter 400 of FIG. 4. The up/down error counter 400 is capable of counting from 0 to 15 (i.e. 0000 to 1111). The input 401 of the up/down error counter 400 would receive the error location bits 315 in the serial form, and the up/down error counter 400 would perform a one-unit increment (i.e. increasing the count value by 1) in response to receiving a binary 1 read error and would perform a one-unit decrement (i.e. decreasing the count value by 1) in response to receiving a binary 0 read error. The 4 bits output Q0~Q3 of the up/down error counter 400 would be used against a threshold to determine whether to adjust a parameter such as a sensing reference (e.g. Vref or Iref) of the memory device (e.g. 200).

Figure 5:
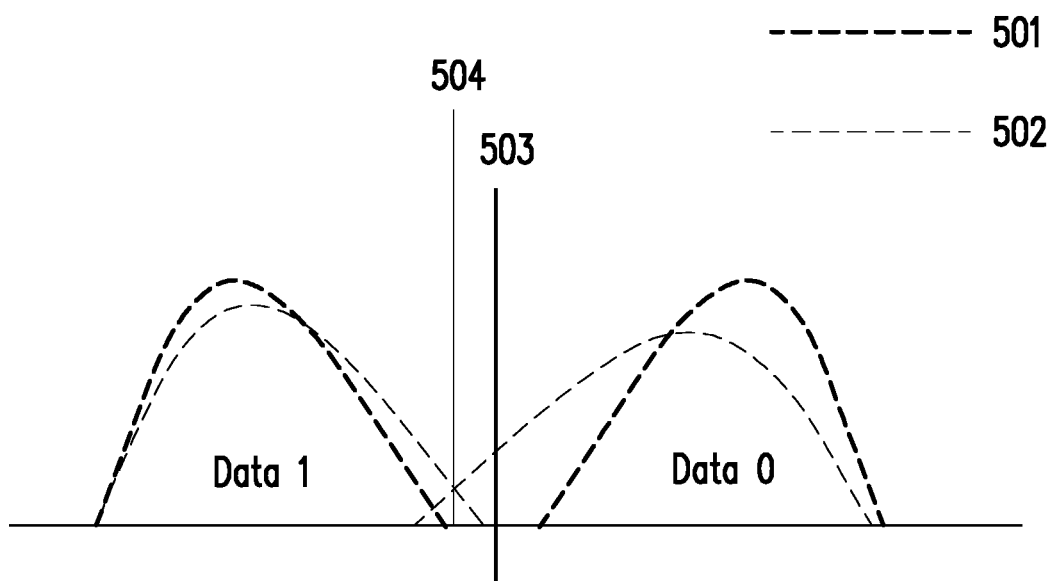
FIG. 5 shows the concept of adjusting the sensing reference according to an exemplary embodiment of the disclosure.

The concept of adjusting the sensing reference (e.g. Vref or Iref) is shown in FIG. 5. In FIG. 5, the first waveform 501 having a first sensing reference level 503 is a characterization of the application of the sensing reference before the high temperature data retention (HTDR) loss. After it has been determined that the difference between the amount of binary 1 read errors and the amount of binary 0 read errors has reached a positive predetermined threshold which means that more of the readings of binary 1 turns out to be errors than the readings of binary 0, the sensing reference would then be adjusted toward binary 1 to result in more readings of binary 0. Thus, after the HTDR loss, the second waveform 502 having a second sensing reference level 504 becomes the new characterization of the application of the sensing reference.

Figure 6:
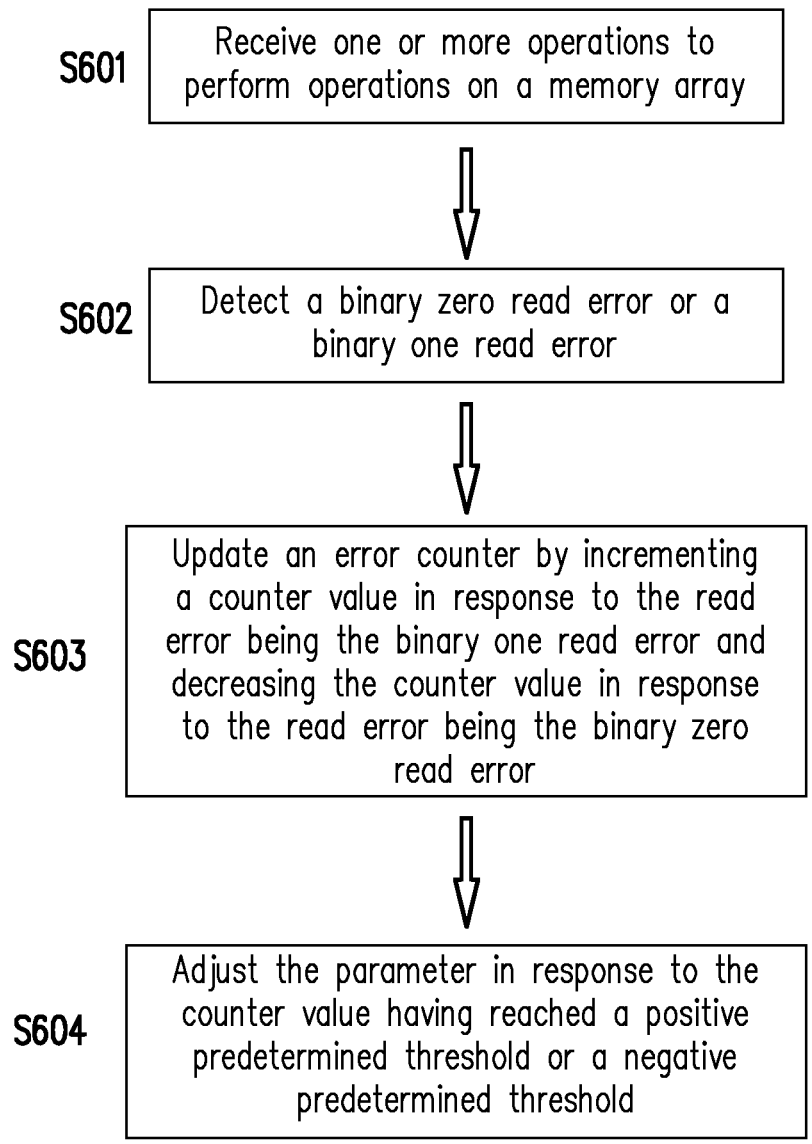
FIG. 6 shows the method of adjusting a parameter of a memory device according to an exemplary embodiment of the disclosure.

For the aforementioned memory device (e.g. 200), the disclosure also provides a method of adjusting a parameter of the memory device as shown in the flow chart of FIG. 6. Referring to FIG. 6, in step S601, the memory device would receive one or more operations with each of the operations being a read operation or a write operation, through a connection interface to perform the operations on a memory array. In step S602, the memory device would detect, based on performing the operations on the memory array, a read error which is either a binary 0 read error or a binary 1 read error. In step S603, the memory device would update an error counter of the memory array by incrementing an counter value of the error counter in response to a binary 1 read error and decreasing the counter value in response to a binary 0 read error. In step S604, the memory device would adjust the parameter in response to the counter value having reached a positive predetermined threshold or a negative predetermined threshold.

The provided method of adjusting a parameter of the memory device would essentially adjust one or more key parameters based on the counter value which reflects upon an amount of binary 0 read error(s) or an amount of binary 1 read error(s), or a difference between the amount of binary 0 read error(s) and the amount of binary 1 read error(s). According to an exemplary embodiment, after the error counter has collected the difference of bit errors between the binary 0 and binary 1 read errors, the memory device would be able to determine the direction of the subsequent adjustment. If the amount of binary 0 read error reaches the amount of binary 1 read error by a first predetermined threshold, the sensing reference could be automatically adjusted toward binary 1 until the difference between the amounts of binary 0 read error and the binary 1 read error is less than a second predetermined threshold. On the contrary, if the amount of binary 1 read error reaches the amount of binary 0 read error by a third predetermined threshold, the sensing reference could be automatically adjusted toward binary 0 until the difference between the amounts of binary 0 read error and the binary 1 read error is greater than a forth predetermined threshold.

The error counter could be used to track the error bits from a full chip cell array read or from a partial cell array read. The adjustment of the sensing reference may occur during a power on operation, after read command, before a power down operation, after resuming from a power down operation, or through a separate command. The adjustment of the sensing reference could be accomplished by using ECC or without ECC. The adjustment of the sensing reference could be accomplished by, for example, adjusting the fuse bits stored in the fuse blowing controller (e.g. 240) to adjust the setting of the corresponding sensing reference. In some embodiments, the memory device may automatically adjust more than one sensing references.

During a test procedure at the factory, an entire memory block could be tested according to a preset pattern. The preset pattern could be, for example, all ones, all zeros, a checkboard pattern, or a binary inverse of the checkboard pattern. Next, binary 0 and binary 1 read errors could be collected by reading from the preset pattern stored in the memory block if exist. When the memory device has been sold to a customer, method of adjusting a parameter of the memory device could be performed when the memory device is performing a power up procedure, is performing power down procedure, or performs in response to receiving a command.

An error counter could be used to collect the read errors and subsequently a sensing reference could be adjusted improve re-balance between the binary 0 and binary 1 read errors. The reading procedures could be performed by applying margins so that the passing bits have good margins. The reading procedure could be performed multiple times until the sensing reference is stable.

The error counter would typically be initialized to zero and continuously count up or count down in response to receiving a binary 0 read error and a binary 1 read error. Once the counting value of the error counter reaches a positive predetermined threshold or a negative predetermined threshold, the adjustment of the parameter would be performed, and then the error counter is reset back to zero.

For example, if a write operation has been received through a connection interface, the sensing reference could be adjusted in response to the counting value of the error counter reaching a positive or a negative threshold, and then the counting value is reset back to zero after the sensing reference has been adjusted. The sensing reference could be adjusted by fuses controlled by a fuse blowing controller. The fusing blowing controller may store values which corresponds to the setting of the sensing reference so as to change the sensing reference by blowing certain fuses. In some embodiments, the write voltage and write timing may also be parameters to be adjusted based on the above described counting technique of this disclosure.

Figure 7:
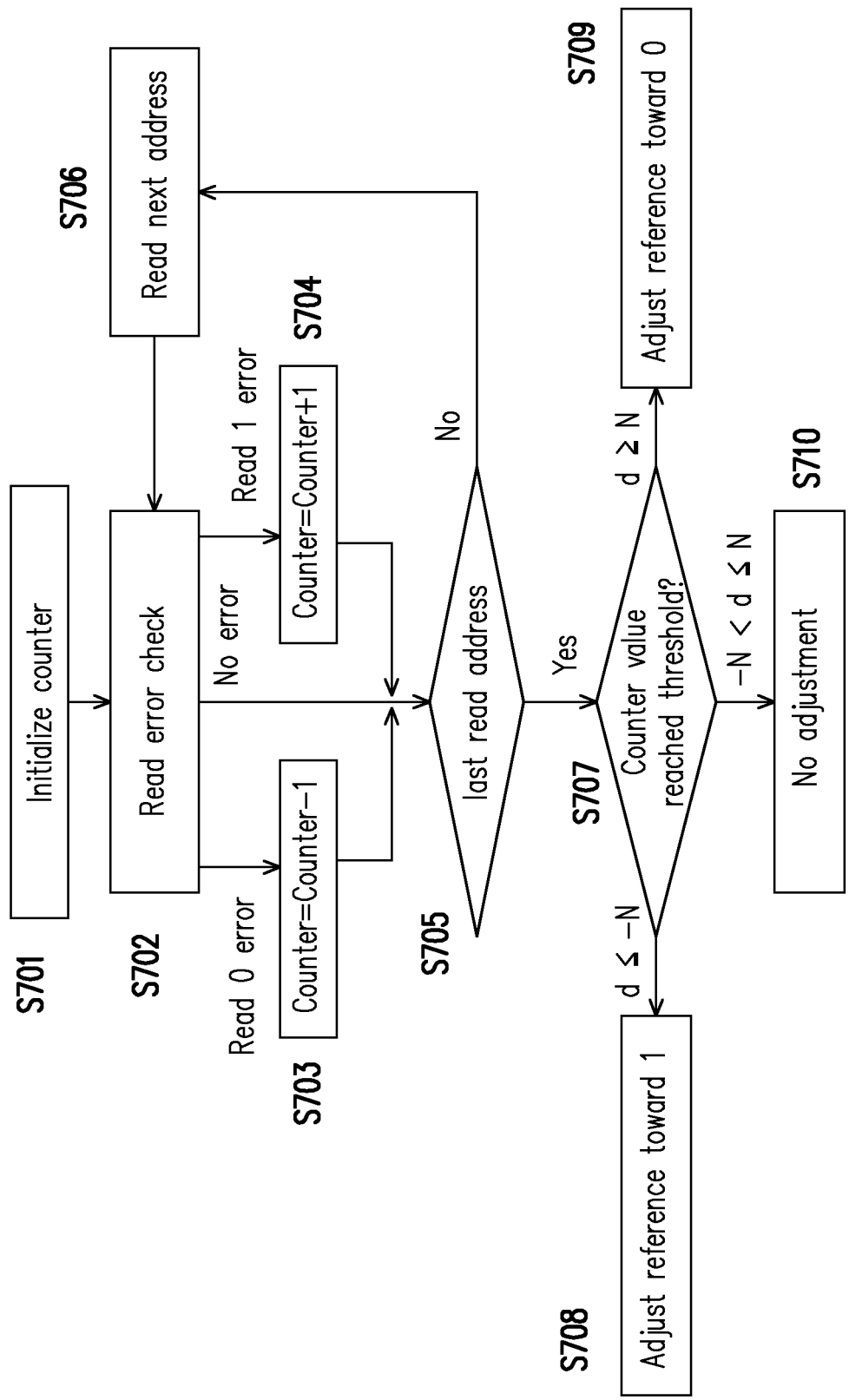
FIG. 7 shows the method of adjusting a sensing reference according to an exemplary embodiment of the disclosure.
Figure 8:
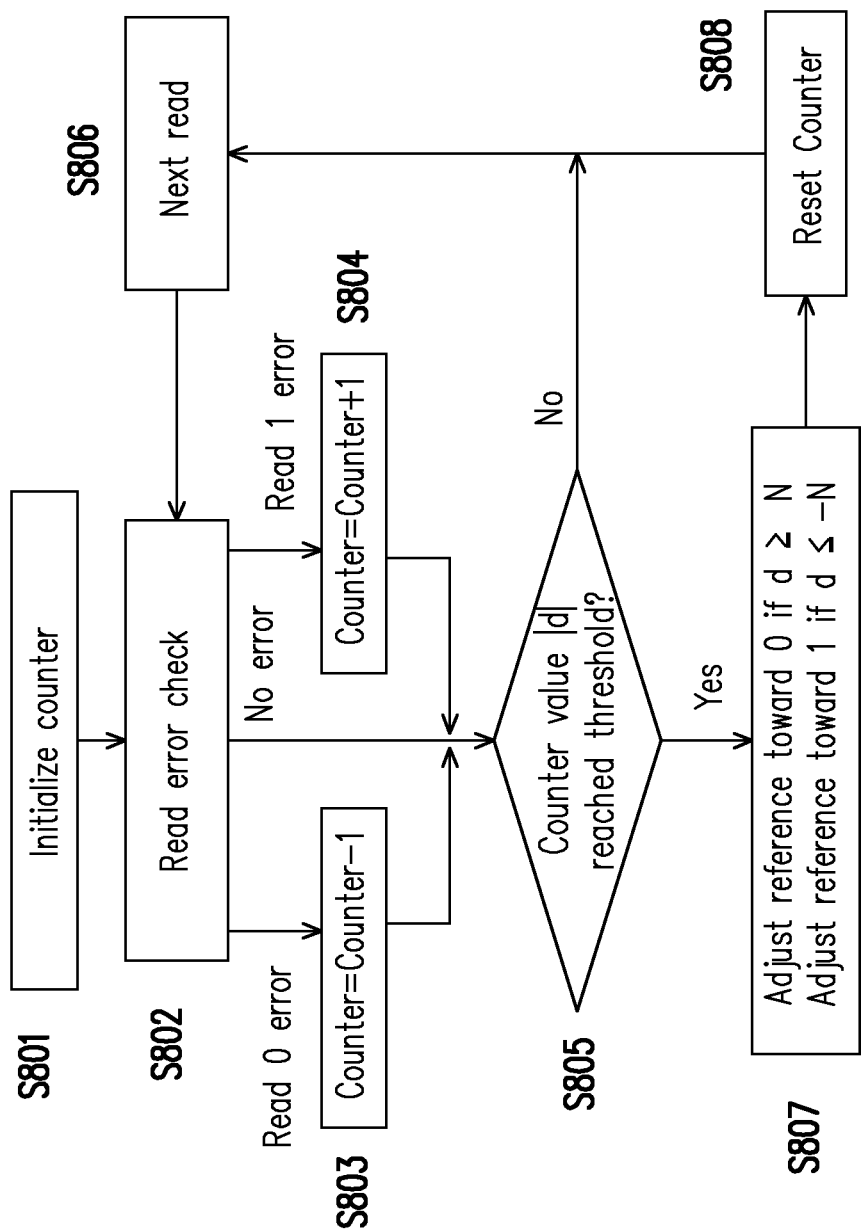
FIG. 8 shows the method of adjusting a sensing reference according to an exemplary embodiment of the disclosure.
Figure 9:
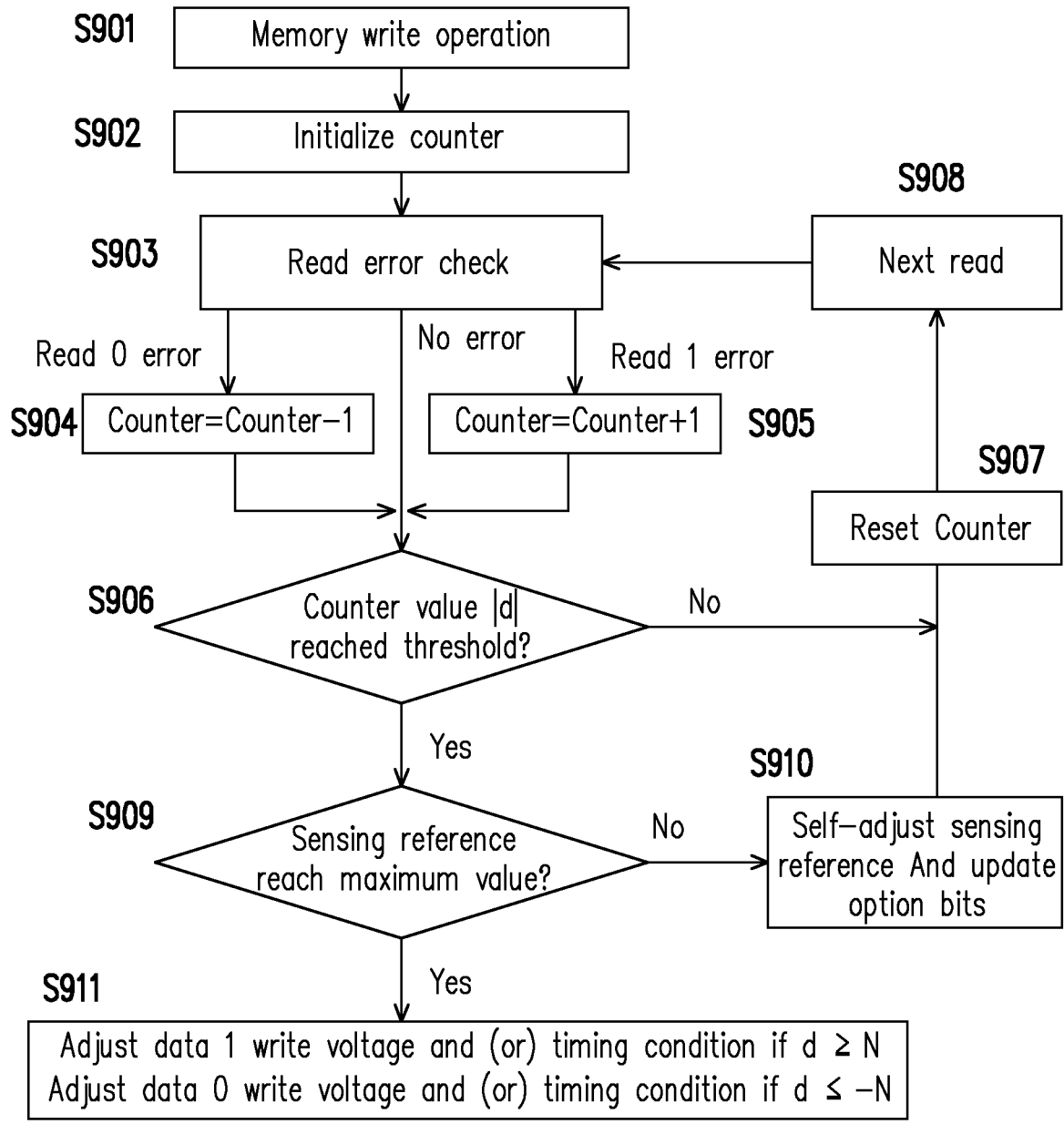
FIG. 9 shows the method of adjusting a write voltage according to an exemplary embodiment of the disclosure.

To further elaborate on the concept as disclosed in FIG. 6 and its corresponding written descriptions, FIGS. 7-9 discloses various exemplary embodiments of the method of adjusting a parameter of the memory device. FIG. 7 shows a method of adjusting a sensing reference by a test procedure according to one embodiments of the disclosure. In step S701, the memory device would initialize counting a counter value d of an error counter as zero. In step S702, the memory device would perform a read operation on an address of a memory bank to determine whether a read error has occurred. In step S703, if there is a binary "0" read error, the error counter would perform a one-unit decrement (d=d−1). In step S704, if there is a binary 1 read error, the error counter would perform a one-unit increment (d=d+1).

If there is no read error, then the memory device would determine if the address is the last address for performing the read operation (step S705). If yes, then the process would proceed to step S707; otherwise, a read operation on the next address would be performed in step S706, and the process would loop back to step S702. In step S707, the memory device would determine whether the counter value d has reached a predetermined threshold N or −N. If d≤−N, then the memory device would adjust the sensing reference toward the binary 1 value (step S708). If d≥N, then the memory device would adjust the sensing reference toward the binary 0 value (step S709). If −N≤d≤N, then the memory device would keep the sensing reference at its current level (step S710).

FIG. 8 shows a method of adjusting a sensing reference as a user operation according to another embodiments of the disclosure. In step S801, the memory device would initialize counting a counter value d of an error counter as zero. In step S802, the memory device would perform a read operation on an address of a memory bank to determine whether a read error has occurred. In step S803, if there is a binary 0 read error, the error counter would perform a one-unit decrement (d=d−1). In step S804, if there is a binary 1 read error, the error counter would perform a one-unit increment (d=d+1).

If there is no read error, then the memory device would determine if the absolute value of the counter value d has reached a predetermined threshold N (step S805). If yes, then the process would proceed to step S807; otherwise, a next read operation would be performed in step S806, and the process would loop back to step S802. In step S807, if d≥N, then the memory device would adjust the sensing reference toward the binary 0 value. If d≤−N, then the memory device would adjust the sensing reference toward the binary 1 value. In step S808, the counter value d of the error counter would be reset back to zero and the process proceeds from step S806.

The above described method of adjusting a parameter of a memory device would also be applicable for adjusting a write voltage and/or write timing to reduce the read errors, and an embodiment of such method is shown in FIG. 9. In step S901, the memory device would receive an instruction to perform a write operation in a memory location. In step S902, the memory device would initialize counting a counter value d of an error counter as zero. In step S903, the memory device would perform a read operation on the memory location to determine whether a read error has occurred. In one embodiment, a margin would be applied when performing the read operation. In step S904, if there is a binary zero read error, the counter would perform a one-unit decrement (d=d−1). In step S905, if there is a binary one read error, the counter would perform a one-unit increment (d=d+1).

If there is no read error, then the memory device would determine if the absolute value of the counter value d has reached a predetermined threshold N (step S906). If yes, then the process would proceed from step S909; otherwise, the counter value d of the error counter would be reset to zero (step S907), then a next read operation would be performed (step S908) and the process would loop back to step S903. In step S909, the memory device would determine whether the sensing reference has reached a maximum value or a minimum value. If the sensing reference has not reached the maximum value or the minimum value, then the memory device would adjust the sensing reference toward the binary 0 value if d≥N and adjust the sensing reference toward the binary 1 value if d≤−N (step S910). If the sensing reference has reached the maximum value or the minimum value, then the process would proceed from step S911. In step S911, the binary 1 write voltage and a timing condition would be adjusted if d>N, and the binary 0 write voltage and a timing condition would be adjusted if d<−N. It is noted in this embodiment, while the sensing reference can't be further adjusted (i.e. has reached the maximum value or the minimum value), the adjustment of the write voltage and the timing condition (step S911) can help to reduce the tendency of occurring the read errors.

In view of the aforementioned descriptions, the disclosure is suitable for being used in a memory device such as a flash memory, a RRAM, or other types of memory and may be able to decrease the cost of testing and improve the yield during manufacturing by adjusting the level of a sensing reference to improve the yield and by adjusting the parameter(s) such as a write voltage, a forming voltage, a set voltage, or a reset voltage so as to optimize write conditions. The disclosure may also improve the reliability during a customer's operation by using a fuse technique to automatically adjust the level of a sensing reference to decrease errors during a customer's usage and to adjust the parameter(s) such as write voltage, a forming voltage, a set voltage, or a reset voltage in order to optimize the endurance of the memory device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory device comprising:
   a connection interface;
   a memory array comprising a error counter and a plurality of memory cells associated with a parameter; and
   a memory control circuit, coupled to an error counter, the connection interface, and the memory array, and configured at least to:
   receive operations, each of the operations being a read operation or a write operation, through the connection interface to perform the operations on the memory array;
   detect, based on performing the operations on the memory array, a read error which is either a binary 0 read error or a binary 1 read error;
   update the error counter by incrementing an counter value of the error counter in response to the read error being the binary 1 read error and decreasing the counter value in response to the read error being the binary 0 read error; and
   adjust the parameter in response to the counter value having reached a positive predetermined threshold or a negative predetermined threshold.

2. The memory device of claim 1, wherein the counter value records a difference between an amount of binary 1 read errors and an amount of binary 0 read errors from performing the operations on the memory array.

3. The memory device of claim 2, wherein memory control circuit is configured to perform the operations on the memory array comprising:
   perform the operations which includes the read operation on the memory array by applying a margin.

4. The memory device of claim 2, wherein the memory control circuit is configured to adjust the parameter comprising:
   adjust a sensing reference which is either a reference voltage or a reference current of a sense amplifier associated with the plurality of memory cells.

5. The memory device of claim 4, wherein memory control circuit is configured to adjust the parameter in response to the counter value having reached the positive predetermined threshold or the negative predetermined threshold comprising:
   adjust the sensing reference in response to the counter value having reached an absolute value of a predetermined threshold.

6. The memory device of claim 4, wherein the memory control circuit is configured to adjust the sensing reference which is associated with the plurality of memory cells comprising:
   reset the counter value to zero;
   perform read operations on the plurality of memory cells;
   accumulate the amount of binary 1 read errors and the amount of binary 0 read errors; and
   adjust the sensing reference so as to decrease either the amount of binary 1 read errors or the amount of binary 0 read errors based on whichever is higher.

7. The memory device of claim 6, wherein the memory control circuit is further configured to repeatedly adjust the sensing reference until the counter value is below a positive predetermined threshold or is higher than a negative predetermined threshold.

8. The memory device of claim 6, wherein the memory control circuit is configured to update the error counter comprising:
   update the error counter by applying a predetermined data pattern and a binary opposite of the predetermined data pattern before memory control circuit is configured to adjust the reference voltage or the reference current.

9. The memory device of claim 4, wherein the memory control circuit is further configured to adjust the sensing reference at different temperatures as the sensing reference varies according to different temperature.

10. The memory device of claim 1, wherein the parameter is a sensing reference, a write voltage, a program voltage, a set voltage, a reset voltage, a forming voltage, or a timing.

11. A method of adjusting a parameter used of a memory device, the method comprising:
    receiving operations, each of the operations being a read operation or a write operation, through a connection interface to perform the operations on a memory array;
    detecting, based on performing the operations on the memory array, a read error which is either a binary 0 read error or a binary 1 read error;
    updating an error counter of the memory array by incrementing an counter value of the error counter in response to the read error being the binary 1 read error and decreasing the counter value in response to the read error being the binary 0 read error; and
    adjusting the parameter in response to the counter value having reached a positive predetermined threshold or a negative predetermined threshold.

12. The method of claim 11, wherein updating the error counter further comprising, recording a difference between an amount of binary 1 read errors and an amount of binary 0 read errors from performing the operations on the memory array.

13. The method of claim 12, wherein performing the operations on the memory array comprising:
    performing the operations including the read operation on the memory array by applying a margin.

14. The method of claim 12, wherein adjusting the parameter comprising:
    adjust a sensing reference which is either a reference voltage or a reference current of a sense amplifier associated with the plurality of memory cells.

15. The method of claim 14, wherein adjusting the parameter in response to the counter value having reached the positive predetermined threshold or the negative predetermined threshold comprising:
    adjusting the sensing reference in response to the counter value having reached an absolute value of a predetermined threshold.

16. The method of claim 14, wherein adjusting the sensing reference which is associated with the plurality of memory cells comprising:
    resetting the counter value to zero;
    performing read operations on the plurality of memory cells;
    accumulating the amount of binary 1 read errors and the amount of binary 0 read errors; and
    adjusting the sensing reference so as to decrease either the amount of binary 1 read errors or the amount of binary 0 read errors based on whichever is higher.

17. The method of claim 16 further comprising:
    adjusting the sensing reference until the counter value is below a positive predetermined threshold or is higher than a negative predetermined threshold.

18. The method of claim 16, wherein updating the error counter comprising:
    updating the error counter by applying a predetermined data pattern and a binary opposite of the predetermined data pattern before memory control circuit is configured to adjust the reference voltage or the reference current.

19. The method of claim 14 further comprising:
adjusting the sensing reference at different temperatures as the sensing reference varies according to different temperature.

20. The method of claim 11, wherein the parameter a sensing reference, a write voltage, a program voltage, a set voltage, a reset voltage, a forming voltage, or a timing.

* * * * *